(12) United States Patent
Shi et al.

(10) Patent No.: US 7,049,878 B2
(45) Date of Patent: May 23, 2006

(54) DOWN-CONVERTER USING AN ON-CHIP BIAS CIRCUIT FOR ENHANCING SYMMETRY AND LINEARITY AND TESTING DEVICE THEREOF

(75) Inventors: Bingxue Shi, Beijing (CN); Baoyong Chi, Beijing (CN)

(73) Assignee: Winbond Electronics Corp., Hsinchu (TW)

( * ) Notice: Subject to any disclaimer, the term of this patent is extended or adjusted under 35 U.S.C. 154(b) by 120 days.

(21) Appl. No.: 10/860,223

(22) Filed: Jun. 3, 2004

(65) Prior Publication Data

US 2005/0270081 A1    Dec. 8, 2005

(51) Int. Cl.
*G06F 7/44* (2006.01)
(52) U.S. Cl. ...................... 327/359; 455/326
(58) Field of Classification Search .................. None
See application file for complete search history.

(56) References Cited

U.S. PATENT DOCUMENTS

| | | | | |
|---|---|---|---|---|
| 4,216,431 A | * | 8/1980 | Shibata et al. | 455/333 |
| 4,479,259 A | * | 10/1984 | Fenk | 455/318 |
| 6,335,651 B1 | * | 1/2002 | Fayyaz | 327/359 |

* cited by examiner

*Primary Examiner*—Timothy P. Callahan
*Assistant Examiner*—An T. Luu
(74) *Attorney, Agent, or Firm*—J.C. Patents

(57) ABSTRACT

A down-converter and a testing device for the down-converter are provided. The down-converter implements a Class-AB single-end input, differential output double balanced mixer structure. By introducing an on-chip bias loop, it significantly improves the symmetry and linearity of the mixer. The down-converter on-chip implements an input impedance match circuit and an open-drain output stage. By optimizing the circuit structure and each device, it achieves the objectives of a high conversion gain, high linearity, and low noise coefficient.

8 Claims, 3 Drawing Sheets

US 7,049,878 B2

DOWN-CONVERTER USING AN ON-CHIP BIAS CIRCUIT FOR ENHANCING SYMMETRY AND LINEARITY AND TESTING DEVICE THEREOF

BACKGROUND OF THE INVENTION

1. Field of the Invention

The present invention generally relates to a down-converter. More specifically, the present invention relates to a down-converter using an on-chip bias circuit for enhancing symmetry and linearity of an output signal and a testing device for testing the down-converter.

2. Description of Related Art

A down-converter is a device for performing frequency translation in such a manner that the output frequencies are lower than the input frequencies. The down-converter is the last stage in an RF front end of a receiver. The down-converter affects the linearity of the RF front end of the receiver most significantly. Hence, the down-converter should be able to provide highly linear characteristics. Also, the down converter should have a 50Ω input resistor and a lower noise coefficient. In addition, considering that most low noise amplifiers have single-end output, the down-converter should also support a single-end input structure.

There is a requirement for a down-converter that implements a Class-AB single-end input, differential output double balanced mixer structure. Also, the down-converter should implement an on-chip bias loop, for improving the symmetry and linearity of the mixer. Further the down-converter on-chip implement an input impedance match circuit and an open-drain output stage. Hence, a down-converter, which by optimizing its circuit structure and each device, can achieve the objectives of a high conversion gain, high linearity, and low noise coefficient is required.

SUMMARY OF THE INVENTION

The present invention is directed to a down-converter comprising an on-chip bias circuit for enhancing symmetry and linearity of an output signal. The down-converter described according to an embodiment of the present invention, comprises: an input stage and a bias circuit unit, comprising a radio frequency signal input terminal, a noise suppressing unit coupled to the input stage and the bias circuit unit; and a frequency conversion operation unit, also coupled to the input stage and the bias circuit unit. The input stage and the bias circuit unit convert a single-end voltage signal to a differential current signal. The noise suppressing unit is coupled to the input stage and the bias circuit. The frequency conversion operation unit comprises a local vibration signal buffer comprising two input terminals to receive a local vibration signal, a first output terminal, and a second output terminal.

The present invention is directed to an input stage and a bias circuit unit for converting a single-end voltage signal to a differential current signal. The input stage and the bias circuit unit according to an embodiment of the present invention comprises: a first transistor comprising a drain, a gate, and a source, the drain being coupled to a radio frequency signal input terminal, the source being coupled to a ground terminal; a second transistor comprising a drain, a gate, and a source, the source being coupled to the drain of the first transistor and to the radio frequency signal input terminal; a third transistor comprising a drain, a gate, and a source, the gate being coupled to the gate of the first transistor and to the radio frequency signal input terminal, the source being coupled to the source of the first transistor and to the ground terminal; a fourth transistor comprising a drain, a gate, and a source, the gate being coupled to the drain of the fourth transistor and to the gate of the second transistor; and a fifth transistor comprising a drain, a gate, and a source, the gate being coupled to the drain of the fifth transistor and to the gate of the first transistor and to the source of the fourth transistor, the source being coupled to the source of the first transistor and to the ground terminal.

In one embodiment of the present invention, the input stage and the bias circuit unit further comprises a PMOS transistor comprising a drain, a gate, and a source, the gate being coupled to the drain of the PMOS transistor and to the drain of the fourth transistor.

In one embodiment of the present invention, a rated current of the input stage and the bias circuit unit flowing through the first, second, and third transistors is 2.25 mA.

In one embodiment of the present invention, a noise suppressing unit includes: a first MIM filter capacitor comprising a first terminal and a second terminal, the first terminal being coupled to the gate of the fourth transistor and to the gate of the second transistor, the second terminal being coupled to the ground terminal; and a second MIM filter capacitor comprising a first terminal and a second terminal, the first terminal being coupled to the gate of the fifth transistor and to the gate of the first transistor, the second terminal being coupled to the ground terminal.

In one embodiment of the present invention, wherein a frequency converting operation unit comprises: a sixth NMOS transistor comprising a drain, a gate, and a source, the gate being coupled to the first output terminal of the local vibration signal buffer, the source being coupled to the drain of the second transistor; a seventh NMOS transistor comprising a drain, a gate, and a source, the source being coupled to the source of the seventh NMOS transistor; an eighth NMOS transistor comprising a drain, a gate, and a source, the gate being coupled to the gate of the seventh NMOS transistor and to the second output terminal of the local vibration signal buffer, the source being coupled to the drain of the third transistor; and a ninth NMOS transistor comprising a drain, a gate, and a source, the gate being coupled to the first output terminal of the local vibration signal buffer, the source being coupled to the source of the eighth NMOS transistor and to the drain of the third transistor.

The present invention is directed to an input stage and a bias circuit device, comprising a radio frequency signal input terminal, the input stage and the bias circuit unit converting a single-end voltage signal to a differential current signal. The input stage and bias circuit unit according to an embodiment of the present invention comprises: a first transistor comprising a drain, a gate, and a source, the drain being coupled to the radio frequency signal input terminal, the source being coupled to a ground; a second transistor comprising a drain, a gate and a source, the source being coupled to the drain of the first transistor and to the radio frequency signal input terminal; a third transistor comprising a drain, a gate and a source, the gate being coupled to the gate of the first transistor and to the radio frequency signal input terminal, the source being coupled to the source of the first transistor and to a ground terminal; a fourth transistor comprising a drain, a gate and a source, the gate being coupled to the drain of the fourth transistor and to the gate of the second transistor; and a fifth transistor comprising a drain, a gate and a source, the gate being coupled to the drain of the fifth transistor and to the gate of the first transistor and to the source of the fourth transistor, the source being coupled to the source of the first transistor and to the ground terminal.

In one embodiment of the present invention, the input stage and the bias circuit unit further comprises a PMOS transistor comprising a drain, a gate and a source, the gate being coupled to the drain of the PMOS transistor and to the drain of the fourth transistor.

In one embodiment of the present invention, a rated current of the input stage and the bias circuit device flowing through the first, second and third transistors is 2.25 mA.

The present invention is directed to a testing device for a down-converter. The testing device according to an embodiment of the present invention comprises: an impedance match unit coupled to the down-converter, for implementing an impedance match of a local vibration signal input terminal; a current provider unit coupled to the down-converter and the impedance match unit; a virtual device driver coupled to the current provider unit; a LC match circuit unit, coupled to the impedance match unit for enhancing a conversion gain of the down-converter; a first unbalanced converter, coupled to the impedance match unit for implementing in conjunction with an input terminal of the testing device; and a second unbalanced converter, coupled to the LC match circuit unit, for implementing in conjunction with an output terminal of the testing device.

In one embodiment of the present invention, the impedance match unit is coupled to a radio frequency signal and further comprises: a first blocking capacitor comprising a first terminal and a second terminal, the first terminal being coupled to the down-converter, the second terminal being coupled to the radio frequency signal; a second blocking capacitor comprising a first terminal and a second terminal, the first terminal being coupled to an input terminal of the down-converter, the second terminal being coupled to the first unbalanced converter; a third blocking capacitor comprising a first terminal and a second terminal, the first terminal being coupled to another input terminal of the down-converter, the second terminal being coupled to the first unbalanced converter; a fourth power filter capacitor comprising a first terminal and a second terminal, the first terminal being coupled to a ground terminal, the second terminal being coupled to the virtual device driver; a fifth blocking capacitor comprising a first terminal and a second terminal, the first terminal being coupled to an output terminal of the down-converter; a sixth blocking capacitor comprising a first terminal and a second terminal, the first terminal being coupled to another output terminal of the down-converter; a first resistor comprising a first terminal and a second terminal, the first terminal being coupled to the input terminal of the down-converter and to the first terminal of the second blocking capacitor, the second terminal being coupled to the ground terminal; and a second resistor comprising a first terminal and a second terminal, the first terminal being coupled to another input terminal of the down-converter and to the first terminal of the third blocking capacitor, the second terminal being coupled to the ground terminal. The resistance of the first resistor is 50Ω. The resistance of the second resistor is 50Ω.

In one embodiment of the present invention, the current provider unit comprises: a first AC feeding inductor comprising a first terminal and a second terminal, the first terminal being coupled to the first terminal of the fifth blocking capacitor and to the down-converter, the second terminal being coupled to the second terminal of the virtual device driver; and a second AC feeding inductor comprising a first terminal and a second terminal, the first terminal being coupled to the first terminal of the sixth blocking capacitor and to the down-converter, the second terminal being coupled to the second terminal of the virtual device driver.

In one embodiment of the present invention, wherein the LC match circuit unit comprises: a third inductor comprising a first terminal and a second terminal, the first terminal being coupled to the second terminal of the fifth blocking capacitor, the second terminal being coupled to an input terminal of second unbalanced converter; a fourth inductor comprising a first terminal and a second terminal, the first terminal being coupled to the second terminal of the sixth blocking capacitor, the second terminal being coupled to another input terminal of the second unbalanced converter; a seventh capacitor comprising a first terminal and a second terminal, the first terminal being coupled to the first terminal of the third inductor and to the second terminal of the fifth blocking capacitor, the second terminal being coupled to a ground; and an eighth capacitor comprising a first terminal and a second terminal, the first terminal being coupled to the first terminal of the fourth inductor and to the second terminal of the sixth blocking capacitor, the second terminal being coupled to the ground.

It will be apparent to a person skilled in the art that both the foregoing general description and the following detailed description are exemplary, and are intended only to provide further explanation of the present invention as claimed Other features, advantages and embodiments of the invention will be apparent to those skilled in the art from the following description, accompanying drawings and appended claims.

DESCRIPTION OF THE PREFERRED EMBODIMENTS

Figure 1:
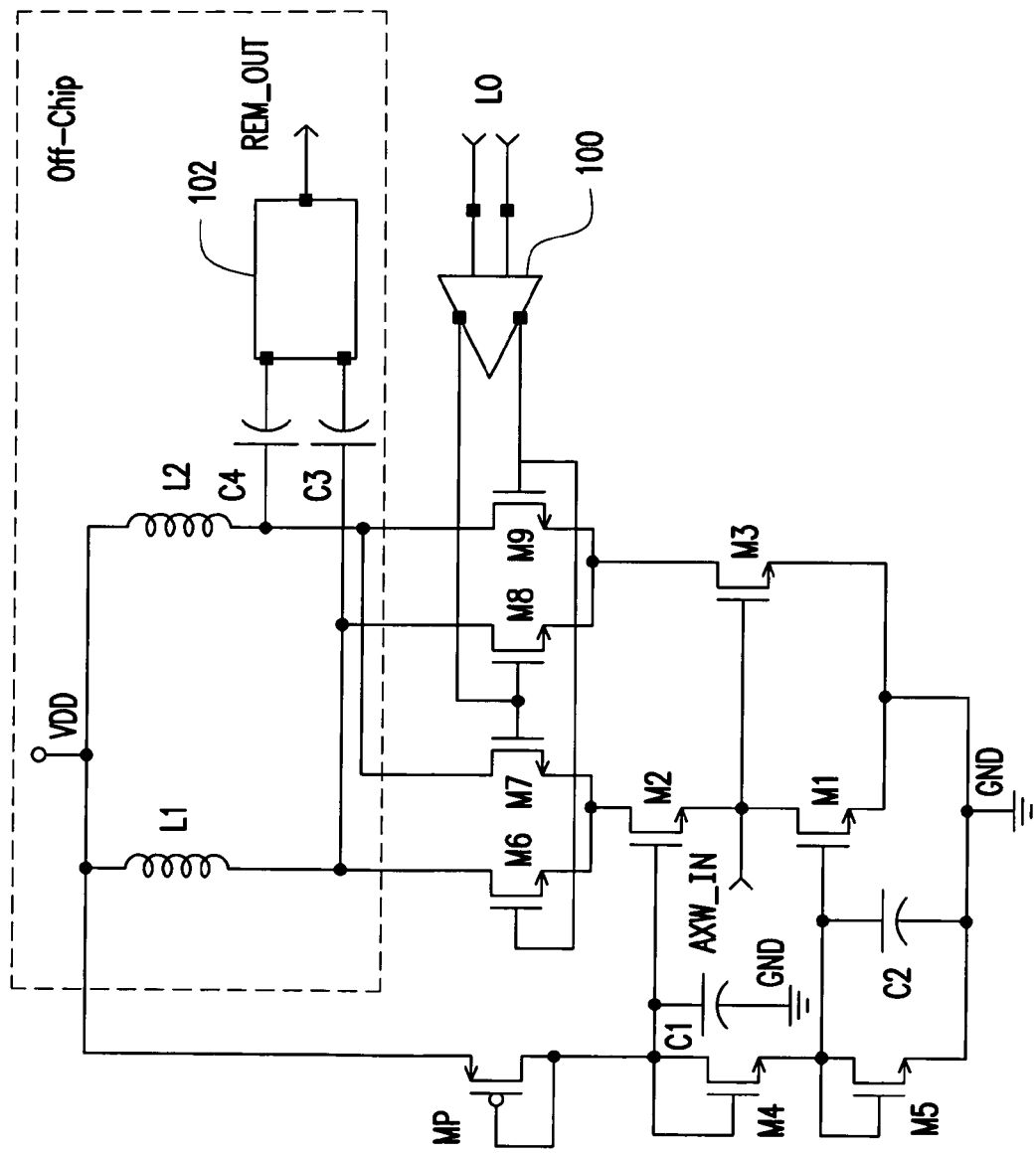
FIG. 1 is a schematic circuit diagram of a down-converter in accordance with one embodiment of the present invention.

FIG. 1 is a schematic circuit diagram of a down-converter in accordance with one embodiment of the present invention. The down-converter implements a Class-AB single-end input, differential output double balanced mixer structure and an on-chip bias circuit. The implementation of the on-chip bias circuit significantly affects the performance of the down-converter circuit as described in the following sections.

Figure 2:
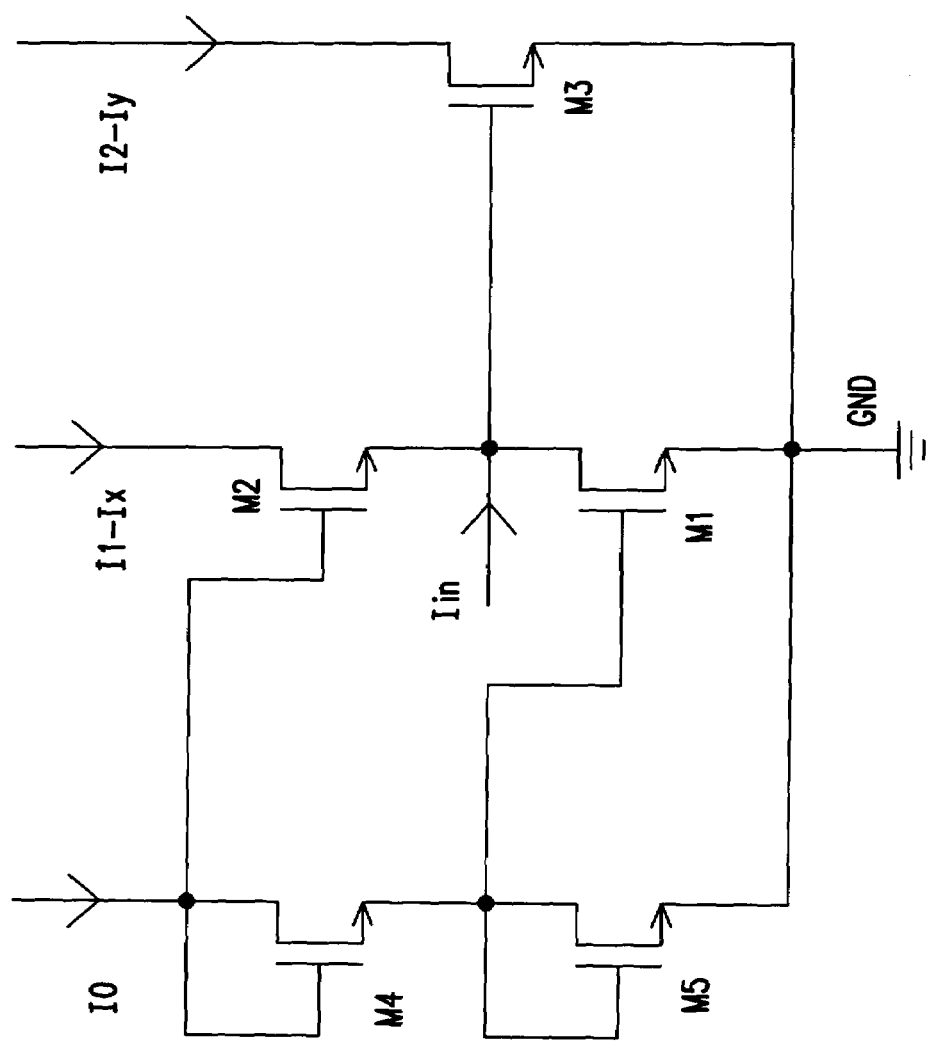
FIG. 2 illustrates an input stage and a bias unit of the down-converter in accordance with one embodiment of the present invention.

An input stage of the down-converter, comprising transistors M1, M2, and M3, converts a single-end voltage signal to a differential current signal. FIG. 2 illustrates the input stage and the bias unit of the down-converter in accordance with one embodiment of the present invention. Iin represents an input RF signal current. I1 and I2 represent the currents flowing through the transistors M2 and M3 when an RF signal is not applied to the input terminal. I1+Ix and I2+Iy represent the currents flowing through the transistors M2 and M3 when the RF signal is applied to the input terminal. According to one embodiment of the present invention, the dimensions of each of the transistors satisfy the following relationship:

$$\left(\frac{W}{L}\right)_{MN1} = \left(\frac{W}{L}\right)_{MN2} \tag{1}$$

$$\left(\frac{W}{L}\right)_{M1} = \left(\frac{W}{L}\right)_{M2} \tag{2}$$

In a condition when the RF signal is not applied to the input terminal, then according to current mirror and translinear principles, the currents flowing through the transistors should satisfy the following relationship:

$$\sqrt{\frac{2I_0}{\left(\frac{W}{L}\right)_{MN1}}} = \sqrt{\frac{2I_0}{\left(\frac{W}{L}\right)_{MN2}}} = \sqrt{\frac{2I_1}{\left(\frac{W}{L}\right)_{M2}}} = \sqrt{\frac{2I_1}{\left(\frac{W}{L}\right)_{M1}}} \tag{3}$$

$$\sqrt{\frac{2I_0}{\left(\frac{W}{L}\right)_{MN1}}} + \sqrt{\frac{2I_0}{\left(\frac{W}{L}\right)_{MN2}}} = \sqrt{\frac{2I_1}{\left(\frac{W}{L}\right)_{M2}}} + \sqrt{\frac{2I_2}{\left(\frac{W}{L}\right)_{M3}}} \tag{4}$$

Based on (3) and (4), it is deduced that $$\frac{I_1}{\left(\frac{W}{L}\right)_{M2}} = \frac{I_2}{\left(\frac{W}{L}\right)_{M3}} \tag{5}$$

In a condition when the RF signal Iin is applied to the input terminal, then according to the current mirror principle the current flowing through the transistor M2 remains I1. Hence, according to the node current balance principle, the following relationships is obtained:

$$I1 + Ix + Iin = I1 \tag{6}$$

I.e., $$Ix = -Iin \tag{7}$$

Considering the circuit loop comprising the transistors MN1, MN2, M2, and M3, the following relationships can be obtained in accordance with the translinear principle:

$$\sqrt{\frac{2I_0}{\left(\frac{W}{L}\right)_{MN1}}} + \sqrt{\frac{2I_0}{\left(\frac{W}{L}\right)_{MN2}}} = \sqrt{\frac{2(I_1 + I_x)}{\left(\frac{W}{L}\right)_{M2}}} + \sqrt{\frac{2(I_2 + I_y)}{\left(\frac{W}{L}\right)_{M3}}} \tag{8}$$

If it is set that $$\frac{I_0}{\left(\frac{W}{L}\right)_{MN1}} = \frac{I_0}{\left(\frac{W}{L}\right)_{MN2}} = \frac{I_1}{\left(\frac{W}{L}\right)_{M2}} = \frac{I_2}{\left(\frac{W}{L}\right)_{M3}} = A,$$

$$\left(\frac{W}{L}\right)_{M2} = K2, \left(\frac{W}{L}\right)_{M3} = K3$$

then it is deduced from (8) that $$2 \cdot \sqrt{A} = \sqrt{A + \frac{I_x}{I_2}} + \sqrt{A + \frac{I_y}{I_3}} \tag{9}$$

If the first term on the right hand side of (9) is shifted to the left hand side of (9), and terms on both the side are squared, the following relationship is obtained:

$$4A - 4 \cdot \sqrt{A \cdot \left(A + \frac{I_x}{K_2}\right)} + A + \frac{I_x}{K_2} = A + \frac{I_y}{K_3} \tag{10}$$

Upon performing division by A operation on the terms on both sides of (10), the following relationship is obtained:

$$4 - 4 \cdot \sqrt{1 + \frac{I_x}{K_2 \cdot A}} + \frac{I_x}{K_2 \cdot A} = \frac{I_y}{K_3 \cdot A} \tag{11}$$

If it is assumed that $$\frac{I_x}{K_2} \ll A$$

(i.e., Ix<<I1), then the following relationship is obtained:

$$\sqrt{1 + \frac{I_x}{K_2 \cdot A}} \approx 1 + \frac{1}{2} \cdot \frac{I_x}{K_2 \cdot A} \tag{12}$$

Upon substituting (12) with (11), the following relationship is obtained:

$$\frac{I_y}{I_x} \approx \frac{K_3}{K_2} = \frac{I_2}{I_1}$$

According to equation (13), if the two branches of the input stage have the same DC current (I1=I2) and the input RF signal current Iin is much less than the branch current I1 (or I2), then upon adding the on-chip bias circuit, the RF signal current passing through the two branches have the same magnitude but opposite phases. This design implements the function of converting a single-end voltage signal to a differential current signal. In practice, due to non-ideal effects such as channel length modulation, the translinear and current mirror principles when applied to the circuit of the present invention suffer from a few deviations. Hence, the input stage, the dimension of the transistors in the circuit, and the DC operation points have to be designed using a process of simulation.

If the channel length modulation is neglected, as the transistor M2 operates in the saturation region, and the RF signal is not applied to the input terminal, the following relationship is obtained:

$$I_1 = \frac{1}{2} \cdot \mu_0 C_{ox} \cdot \left(\frac{W}{L}\right)_{M2} \cdot (V_{GM2} - V_{SM2} - V_T)^2 \tag{14}$$

Where $\mu_0$ is the electron migration rate of the transistor M2; $C_{ox}$ is the gate capacitance per unit area of the transistor M2; $V_{GM2}$ is the gate voltage of the transistor M2; $V_{SM2}$ is the source voltage of the transistor M2; and $V_T$ is the threshold voltage of the transistor M2.

If it is assumed that the RF voltage signal is Vin, then the following relationship is obtained:

$$I_1 + I_x = I_1 - I_{in} \quad (15)$$

$$= \frac{1}{2} \cdot \mu_0 C_{ox} \cdot \left(\frac{W}{L}\right)_{M2} \cdot [V_{GM2} - (V_{SM2} + V_{in}) - V_T]^2$$

The input impedance of the down-converter described in the present invention is deduced from (14) and (15) as:

$$R_{in} = \frac{V_{in}}{I_{in}} = \frac{1}{\mu_0 C_{ox} \cdot \left(\frac{W}{L}\right)_{M2} \left[V_{GM2} - \left(V_{SM2} + \frac{V_{in}}{2}\right) - V_T\right]} \quad (16)$$

If it is fixed that $$\frac{1}{\sqrt{2I_1 \cdot \mu_0 C_{ox} \cdot \left(\frac{W}{L}\right)_{M2}}} = R_0, \quad \frac{1}{\sqrt{2(I_1 - I_{in}) \cdot \mu_0 C_{ox} \cdot \left(\frac{W}{L}\right)_{M2}}} = R_1$$

then when Iin≧0, the following relationship is obtained:

$$R_0 \leq R_{in} \leq R_1 \quad (17)$$

and when Iin≦0, the following alternate relationship is obtained:

$$R_0 \geq R_{in} \geq R_1 \quad (18)$$

In order to implement an on-chip input impedance match, generally R0 is chosen as 50 Ω. According to the definition of R0 and R1, when the RF signal current Iin changes from +0.5I1 to −I1, R1 changes from 70.7 Ω to 35.4 Ω. According to (17) and (18), the change in the input impedance Rin of the down-converter described in the present invention is less than that of the change in R1. Hence, when there is a large change in the RF signal current, the change in the input impedance is minimal. Thus, the input stage can effectively implement the input impedance match on-chip such that only a minimal non-linearity is introduced in the circuit when the RF signal is converted from voltage to current. Also, since the conversion of the input RF current from Iin to Ix and Iy is linear, the input stage is highly linear.

In light of the above, since the energy of the RF signal changes dynamically, factors such as the linearity, the input impedance match, and the preciseness of the conversion of the single-end signal to the differential signals are directly related to the branch DC currents I1 and I2. As the DC currents increases an improvement in all the above mentioned factors. However, power consumption of the circuit of the present invention increases with an increase in the DC currents. Hence, in order to maintain a balance between the above mentioned factors and the power consumption the rated DC current of each branch is set as 2.25 mA, in accordance with one embodiment of the invention.

Frequency conversion operation is performed by the four NMOS transistors M4, M5, M6 and M7. If the four transistors operate as ideal switches, the loss introduced by the frequency conversion operation is about 2/π. In practice, however, the loss introduced by the frequency conversion operation is related to the voltage magnitude of the local vibration signal and the dimension of the transistors operating as mixer switches. To reduce output power requirements of the of the local vibrator, the circuit of the present invention implements the local vibration signal buffer on a single chip, amplifies the local vibration signal, and raise its voltage magnitude to reduce the loss occurring in the transistors operating as mixer switches. The dimension of the mixer switches is also optimized.

The down-converter described in the present invention comprises an open-drain output stage. While testing, the feeding inductors L1 and L2, the blocking capacitors C3 and C4, the LC impedance converting circuit and the converting circuit for converting the differential signal to the single-end signal are implemented outside the chip. In order to suppress the noise introduced by the bias circuit (MP, MN1, and MN2), the MIN filter capacitors C1 and C2 are implemented on-chip.

Figure 3:
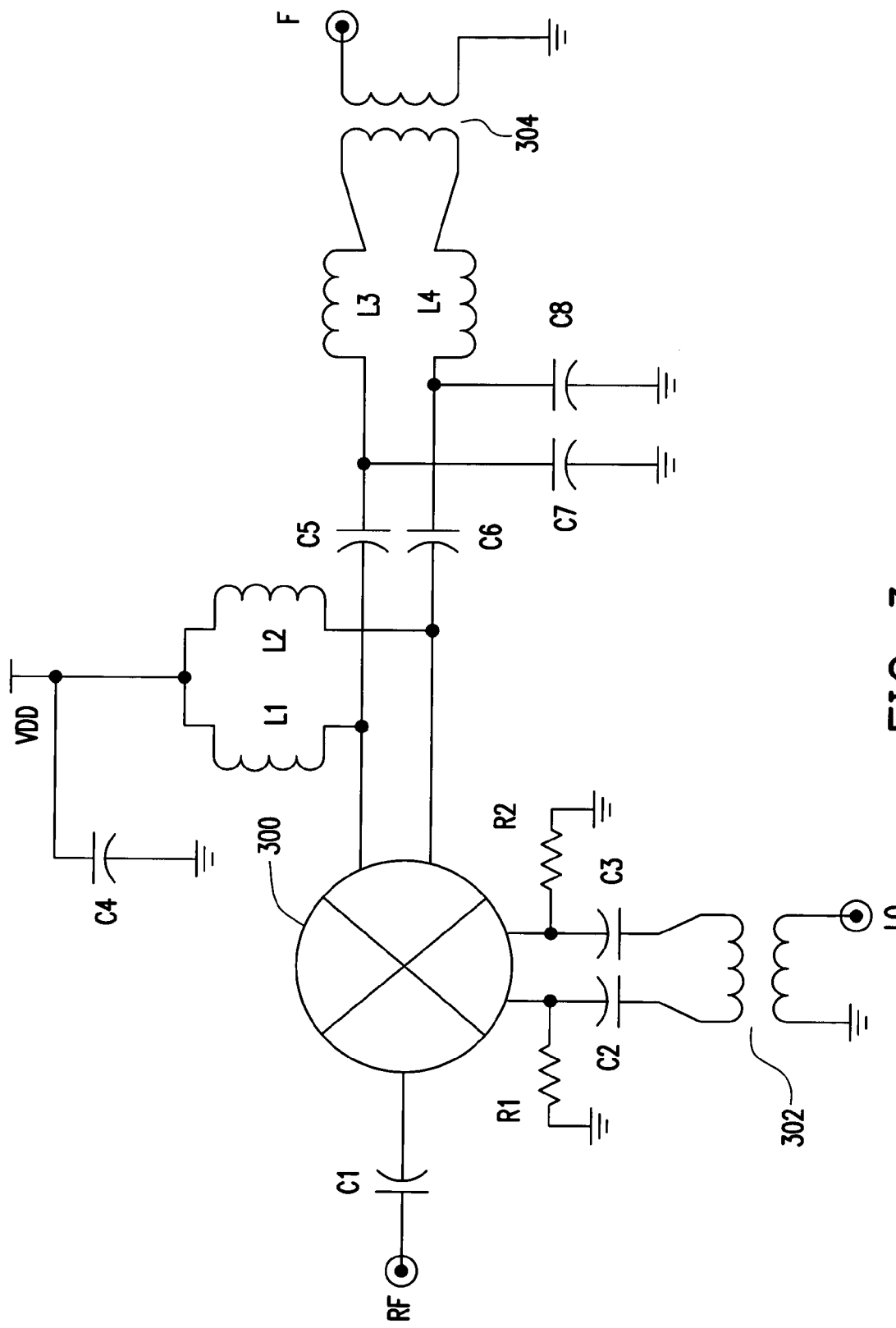
FIG. 3 illustrates a system for testing the down-converter in accordance with one embodiment of the present invention.

FIG. 3 illustrates a system for testing the down-converter in accordance with one embodiment of the present invention. C1, C2, C3, C5, and C6 are blocking capacitors. C4 is a power source filter capacitor. The resistance of R1 and R2 is kept at 50Ω in order to implement impedance matching of the local vibration signal input terminal. L1 and L2 are DC feeding inductors having a large inductance for providing DC current to the down-converter described in the present invention. L3, C7, and L4, C8 comprise two LC match circuits which raise the input impedance of an IF Balun to a higher impedance in order to raise the converting gain of the down-converter. The testing system described in the present invention, comprises two unbalanced converters (Balun). According to one embodiment of the present invention the Balun implemented in the local vibration signal input terminal is an BL2012-10A1850 converter, which is manufactured by ACX. The working bandwidth of this converter ranges from 1700 MHz~2000 MHz. Within this bandwidth, the maximum inserting loss is 1.0 dB; the maximum standing wave ratio is 2; the unbalanced impedance is 50Ω and the balanced impedance is 100Ω. In a practical testing circuit, frequency of the input local vibration signal is around 2150 MHz, which is beyond the working bandwidth of this converter. Hence, the actual inserting loss of the RF Balun exceeds 1.0 dBIF. According to one embodiment of the present invention the Balun implemented in the output terminal is CX2024, which is manufactured by Pulse Company. Impedance conversion ratio of this converter is 1:1, within the working bandwidth range of 50–750 MHz, a typical inserting loss is 0.37 dB and a maximum inserting loss is 0.50 dB. However, this inserting loss is based on the 75Ω system. For the 50Ω system, the inserting loss is much larger.

The down-converter chip is mounted on a printed circuit board. The RF input terminal, the IF output terminal and the local vibration signal input terminal are connected via an SMA connector, coaxial cables and other testing apparatus. The result obtained upon testing the down converter described in the present invention using the testing circuit illustrated in FIG. 3 are shown in Table 1.

TABLE 1

| Testing results of the down-converter | |
|---|---|
| Converting gain (50 Ωload) | 1.5 dB |
| Single band noise coefficient (50 Ω) | 12.2 dB |
| Input 1 db compression point | −1.5 dBm |
| Input Third-order Intermodulation Point | 4 dBM |
| S11 | −16 dB |
| Power Cons | 5.7 mA × 1.8 V |
| Technology | 0.18 um CMOS |
| Chip area | 830 μm × 890 μm |

The above description provides a full and complete description of the preferred embodiments of the present invention. Various modifications, alternate constructions, and equivalents may be made by those skilled in the art without changing the scope or departing from the spirit of the present invention. Accordingly, the above description and illustrations should not be construed as limiting the scope of the invention, which is defined by the following claims.

What is claimed is:

1. A down-converter comprising an on-chip bias circuit for enhancing symmetry and linearity, the down converter comprising:
   an input stage and a bias circuit unit, comprising a radio frequency signal input terminal, the input stage and the bias circuit unit converting a single-end voltage signal to a differential current signal, the input stage and the bias circuit unit further comprising:
      a first transistor, comprising a drain, a gate and a source, the drain being coupled to the radio frequency signal input terminal, the source being coupled to a ground terminal;
      a second transistor, comprising a drain, a gate and a source, the source being coupled to the drain of the first transistor and to the radio frequency signal input terminal;
      a third transistor, comprising a drain, a gate and a source, the gate being coupled to the gate of the first transistor and to the radio frequency signal input terminal, the source being coupled to the source of the first transistor and to the ground terminal;
      a fourth transistor, comprising a drain, a gate and a source, the gate being coupled to the drain of the fourth transistor and to the gate of the second transistor;
      a fifth transistor, comprising a drain, a gate and a source, the gate being coupled to the drain of the fifth transistor, and to the gate of the first transistor and to the source of the fourth transistor, the source being coupled to the source of the first transistor and to the ground terminal;
   a noise suppressing unit, coupled to the input stage and the bias circuit unit; and a frequency conversion operation unit, coupled to the input stage and the bias circuit unit, the frequency converting operation unit comprising a local vibration signal buffer having two input terminals to receive a local vibration signal, a first output terminal and a second output terminal.

2. The down-converter according to claim 1, wherein the input stage and the bias circuit unit further comprise a PMOS transistor comprising a drain, a gate and a source, the gate being coupled to the drain of the PMOS transistor and to the drain of the fourth transistor.

3. The down-converter according to claim 1, wherein the noise suppressing unit comprises:
   a first MIM filter capacitor comprising a first terminal and a second terminal, the first terminal being coupled to the gate of the fourth transistor and the gate of the second transistor, the second terminal being coupled to the ground terminal; and
   a second MIM filter capacitor comprising a first terminal and a second terminal, the first terminal being coupled to the gate of the fifth transistor and to the gate of the first transistor, the second terminal being coupled to the ground terminal.

4. The down-converter according to claim 1, wherein the frequency conversion operation unit comprises:
   a sixth NMOS transistor, comprising a drain, a gate and a source, the gate being coupled to the first output terminal of the local vibration signal buffer, the source being coupled to the drain of the second transistor;
   a seventh NMOS transistor, comprising a drain, a gate and a source, the source of said seventh NMOS transistor being coupled to said source of said seventh NMOS transistor;
   an eighth NMOS transistor, comprising a drain, a gate and a source, the gate being coupled to the gate of the seventh NMOS transistor and to the second output terminal of the local vibration signal buffer, the source being coupled to the drain of the third transistor; and
   a ninth NMOS transistor, comprising a drain, a gate and a source, the gate being coupled to the first output terminal of the local vibration signal buffer, the source being coupled to the source of the eighth NMOS transistor and to the drain of the third transistor.

5. The down-converter according to claim 1, wherein a rated current of the input stage and the bias circuit unit flowing through the first, the second, and the third transistors is 2.25 mA.

6. An input stage and a bias circuit device, comprising a radio frequency signal input terminal, the input stage and the bias circuit unit converting a single-end voltage signal to a differential current signal, the input stage and the bias circuit unit comprising:
   a first transistor, comprising a drain, a gate, and a source, the drain being coupled to the radio frequency signal input terminal, the source being coupled to a ground terminal;
   a second transistor, comprising a drain, a gate and a source, the source being coupled to the drain of the first transistor and to the radio frequency signal input terminal;
   a third transistor, comprising a drain, a gate and a source, the gate being coupled to the gate of the first transistor and to the radio frequency signal input terminal, the source being coupled to the source of the first transistor and to the ground terminal;
   a fourth transistor, comprising a drain, a gate and a source, the gate being coupled to the drain of the fourth transistor and to the gate of the second transistor; and
   a fifth transistor, comprising a drain, a gate and a source, the gate being coupled to the drain of the fifth transistor and to the gate of the first transistor and the source of the fourth transistor, the source being coupled to the source of the first transistor and the ground terminal.

7. The input stage and the bias circuit device according to claim 6, further comprising a PMOS transistor comprising a drain, a gate and a source, the gate being coupled to the drain and to the drain of the fourth transistor.

8. The input stage and the bias circuit device according to claim 6, wherein a rated current of the input stage and the bias circuit device flowing through the first, second, and the third transistors is 2.25 mA.

* * * * *